US006638688B2

(12) United States Patent
Ching et al.

(10) Patent No.: US 6,638,688 B2
(45) Date of Patent: Oct. 28, 2003

(54) SELECTIVE ELECTROPLATING METHOD EMPLOYING ANNULAR EDGE RING CATHODE ELECTRODE CONTACT

(75) Inventors: Kai-Ming Ching, Taiping (TW);
Sheng-Liang Pan, Hsin-Chu (TW);
Hao-Wei Chang, Hsin-chu (TW);
Chun-Hong Chang, Hsin-Chu (TW);
Yen-Ming Chen, Hsin-Chu (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 149 days.

(21) Appl. No.: 09/726,740

(22) Filed: Nov. 30, 2000

(65) Prior Publication Data

US 2002/0064729 A1 May 30, 2002

(51) Int. Cl.[7] ............................. G03C 5/56; G21K 5/10; C25D 5/02
(52) U.S. Cl. ....................... 430/311; 430/322; 430/396; 430/5; 250/492.2; 250/492.22; 205/122; 205/105; 205/135
(58) Field of Search ................................ 430/311, 322, 430/396, 5; 250/492.2–492.22; 205/122, 105, 135

(56) References Cited

U.S. PATENT DOCUMENTS 5,135,636 A   8/1992  Yee et al. ...................... 205/96
5,932,077 A   8/1999  Reynolds ................... 204/244 R
6,056,869 A   5/2000  Uzoh ............................ 205/771
6,132,587 A * 10/2000  Jorne et al. ............. 204/224 R

FOREIGN PATENT DOCUMENTS

JP            4-137631 A  *  5/1992  .................. 438/343

\* cited by examiner

*Primary Examiner*—Mark F. Huff
*Assistant Examiner*—Daborah Chacko-Davis
(74) *Attorney, Agent, or Firm*—Tung & Associates

(57) ABSTRACT

Within both a method for forming a patterned photoresist layer and a method for forming an electroplated patterned conductor layer while employing the patterned photoresist layer as a patterned photoresist plating mask layer there is first provided a substrate. There is then formed over the substrate a blanket photoresist layer formed of a negative photoresist material. There is then photoexposed the blanket photoresist layer to form a photoexposed blanket photoresist layer while employing a photoexposure apparatus which employs an annular edge ring exclusion apparatus positioned over an annular edge ring of the blanket photoresist layer and the substrate. Finally, there is then developed the photoexposed blanket photoresist layer to form a patterned photoresist layer having an annular edge ring excluded over the annular edge ring of the substrate. By employing within the context of the present invention the annular edge ring exclusion apparatus, the electroplated patterned conductor layer is formed with enhanced thickness uniformity.

14 Claims, 2 Drawing Sheets

SELECTIVE ELECTROPLATING METHOD EMPLOYING ANNULAR EDGE RING CATHODE ELECTRODE CONTACT

BACKGROUND OF THE INVENTION

1. Field of the Invention

The present invention relates generally to plating methods employed for forming microelectronic fabrications. More particularly, the present invention relates to selective plating methods employed for forming microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to employ selective plating methods for forming within microelectronic fabrications selectively plated patterned microelectronic conductor layers within microelectronic fabrications.

Selective plating methods are desirable in the art of microelectronic fabrication for forming selectively plated patterned microelectronic conductor layers within microelectronic fabrications insofar as selective plating methods are generally more economical than other methods which may be employed for forming patterned microelectronic conductor layers within microelectronic fabrications, where such other methods may include but are not limited to chemical vapor deposition (CVD) methods and physical vapor deposition (PVD) methods which may be employed for forming patterned microelectronic conductor layers within microelectronic fabrications.

While selective plating methods are thus desirable in the art of microelectronic fabrication for forming selectively plated patterned microelectronic conductor layers within microelectronic fabrications, selective electroplating plating methods in particular are nonetheless also not entirely without problems in the art of microelectronic fabrication for forming selectively plated patterned microelectronic conductor layers within microelectronic fabrications. In that regard, it is known in the art of microelectronic fabrication that selective electroplating methods when employed for forming selectively plated patterned microelectronic conductor layers within microelectronic fabrications often provide non-uniform selectively plated patterned microelectronic conductor layers, in particular with respect to thickness non-uniformity of the selectively plated patterned microelectronic conductor layers.

It is thus desirable in the art of microelectronic fabrication to provide selective plating methods through which there may be formed within microelectronic fabrications selectively plated patterned microelectronic conductor layers with enhanced uniformity, and in particular with enhanced thickness uniformity.

It is towards the foregoing object that the present invention is directed.

Various methods and apparatus have been disclosed in the art of microelectronic fabrication for forming microelectronic conductor layers, and in particular plated microelectronic conductor layers, with desirable properties within the art of microelectronic fabrication.

For example, Yee et al., in U.S. Pat. No. 5,135,636, disclose an electroplating method and an electroplating apparatus which may be employed for forming over a microelectronic substrate employed within a microelectronic fabrication a plated microelectronic conductor layer with enhanced thickness uniformity. To realize the foregoing object, the electroplating method and the electroplating apparatus employ when forming the plated microelectronic conductor layer over the microelectronic substrate employed within the microelectronic fabrication a metal electroplating cathode ring separated from, surrounding and electrically connected to the microelectronic substrate when plating simultaneously over both the microelectronic substrate and the metal electroplating cathode ring the plated microelectronic conductor layer.

In addition, Reynolds, in U.S. Pat. No. 5,932,077, discloses a plating apparatus which may be employed for plating, with enhanced manufacturing efficiency, a microelectronic conductor layer over a microelectronic substrate employed within a microelectronic fabrication while employing a plating method. To realize the foregoing object, the plating apparatus employs a plating chamber having a door upon which may be fixtured the microelectronic substrate over which is formed the microelectronic conductor layer while employing the plating method.

Finally, Uzoh, in U.S. Pat. No. 6,056,869, discloses a method and an apparatus which may be employed for providing a residue free conductor layer formed over a microelectronic substrate employed within a microelectronic fabrication. To realize the foregoing result the method and the apparatus comprise a deplating method and a deplating apparatus by which undesirable conductor layer residues are deplated from edge surfaces and backside surfaces of the microelectronic substrate employed within the microelectronic fabrication.

Desirable in the art of microelectronic fabrication are additional methods and materials which may be employed for forming, with enhanced thickness uniformity, plated microelectronic conductor layers within microelectronic fabrications.

It is towards the foregoing object that the present invention is directed.

SUMMARY OF THE INVENTION

A first object of the present invention is to provide a plating method for forming a plated microelectronic conductor layer within a microelectronic fabrication.

A second object of the present invention is to provide a plating method in accord with the first object of the present invention, wherein the plated microelectronic conductor layer is formed with enhanced thickness uniformity.

A third object of the present invention is to provide a plating method in accord with the first object of the present invention and the second object of the present invention, wherein the plating method is readily commercially implemented.

In accord with the objects of the present invention, there is provided in a first instance by the present invention a method for forming a patterned photoresist layer. To practice the method of the present invention, there is first provided a substrate. There is then formed over the substrate a blanket photoresist layer formed of a negative photoresist material. There is then photoexposed the blanket photoresist layer to form a photoexposed blanket photoresist layer while employing a photoexposure apparatus which employs an annular edge ring exclusion apparatus positioned over an annular edge ring of the blanket photoresist layer and the substrate. Finally, there is then developed the photoexposed blanket photoresist layer to form a patterned photoresist layer having an annular edge ring excluded over the annular edge ring of the substrate.

In further detail, under circumstances where the substrate has formed thereover a blanket electroplating seed layer prior to forming thereover the blanket photoresist layer, and further wherein the blanket photoresist layer is formed upon the blanket electroplating seed layer and the blanket photoresist layer is simultaneously photoexposed and developed to provide in addition to an annular edge ring excluded over an annular edge ring of the blanket electroplating seed layer a series of exposed interior portions of the blanket electroplating seed layer upon which it is desired to form a series of selectively electroplated patterned conductor layers while employing an electroplating method which employs an annular cathode electrode ring contact to the annular edge ring of the blanket electroplating seed layer, the series of selectively electroplated patterned conductor layers formed while employing the electroplating method is formed with enhanced thickness uniformity since the series of selectively electroplated patterned conductor layers formed while employing the electroplating method may be formed with an enhanced electrical contact of the annular cathode electrode ring to the annular edge ring of the blanket electroplating seed layer.

The present invention provides a plating method for forming a plated microelectronic conductor layer within a microelectronic fabrication, wherein the plated microelectronic conductor layer is formed with enhanced thickness uniformity.

The present invention realizes the foregoing object in a first instance by employing within a photoexposure apparatus employed for photoexposing a blanket photoresist layer formed over a substrate to provide a photoexposed blanket photoresist layer formed over the substrate an annular edge exclusion apparatus positioned over an annular edge ring of the blanket photoresist layer and the substrate, such that when the photoexposed blanket photoresist layer is developed to form a patterned photoresist layer, the patterned photoresist layer is formed with an annular edge ring excluded over the annular edge ring of the substrate. Further, by forming in accord with the present invention an annular edge ring of a patterned photoresist layer excluded over a blanket electroplating seed layer there may be formed an optimal electrical contact of an annular cathode electrode ring to the blanket electroplating seed layer and thus provide enhanced thickness uniformity of a series of patterned conductor layers formed employing an electroplating method in conjunction with the blanket electroplating seed layer.

The method of the present invention is readily commercially implemented. The present invention employs methods and materials as are generally known within the art of microelectronic fabrication or readily adapted to the art of microelectronic fabrication but employed within the context of specific limitations to provide the present invention. Since it is thus a series of specific limitations of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
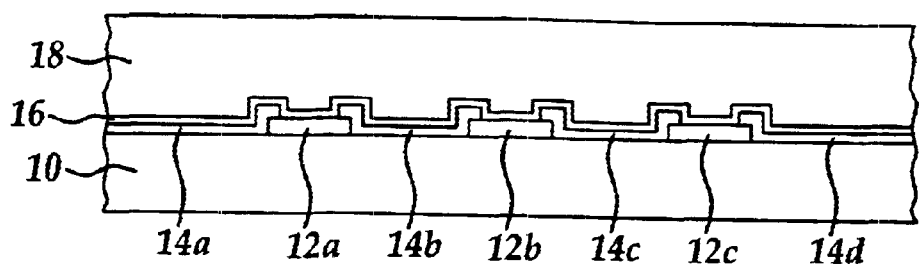
FIG. 1 to FIG. 7 show a series of schematic cross-sectional and schematic plan-view diagrams illustrating the results of progressive stages in forming, in accord with a preferred embodiment of the present invention, a microelectronic fabrication having formed therein a series of reflowed electroplated patterned solder layers.

The present invention provides a plating method for forming a plated microelectronic conductor layer over a microelectronic substrate employed within a microelectronic fabrication, wherein the plated microelectronic conductor layer is formed with enhanced thickness uniformity.

The present invention realizes the foregoing object in a first instance by employing within a photoexposure apparatus employed for photoexposing a blanket photoresist layer formed over a substrate to provide a photoexposed blanket photoresist layer formed over the substrate an edge exclusion apparatus positioned over an annular edge ring of the blanket photoresist layer and the substrate, such that when the photoexposed blanket photoresist layer is developed to form a patterned photoresist layer, the patterned photoresist layer is formed with an annular edge ring excluded over the annular edge ring of the substrate.

In further detail, under circumstances where the substrate has formed thereover a blanket electroplating seed layer prior to forming thereover the blanket photoresist layer, and further wherein the blanket photoresist layer is formed upon the blanket electroplating seed layer and the blanket photoresist layer is simultaneously photoexposed and developed to provide in addition to an annular edge ring excluded over an annular edge of the blanket electroplating seed layer a series of exposed interior portions of the blanket electroplating seed layer upon which it is desired to form a series of selectively electroplated patterned conductor layers while employing an electroplating method which employs an annular cathode electrode ring contact to the annular edge ring of the blanket electroplating seed layer, the series of selectively electroplated patterned conductor layers formed while employing the electroplating method is formed with enhanced thickness uniformity since the series of selectively electroplated patterned conductor layers formed while employing the electroplating method may be formed with an enhanced electrical contact of the annular cathode electrode ring to the annular edge ring of the blanket electroplating seed layer.

Although the preferred embodiment of the present invention illustrates the present invention within the context of forming with enhanced thickness uniformity within a microelectronic fabrication a series of thermally reflowed electroplated patterned solder layers, the present invention may be employed for forming with enhanced thickness uniformity electroplated patterned conductor layers including but not limited to electroplated patterned contact conductor layers, electroplated patterned interconnect conductor layers, electroplated patterned terminal conductor layers and electroplated patterned solder conductor layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 5, there is shown a series of schematic cross-sectional and schematic plan-view diagrams illustrating the results of progressive stages of forming, in accord with a preferred embodiment of the present invention, a microelectronic fabrication having formed therein a series of thermally reflowed patterned solder layers.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed thereover a series of bond pads 12a, 12b and 12c.

Within the preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within a microelectronic fabrication, or in an alternative, the substrate 10 may comprise a substrate as employed within the microelectronic fabrication, wherein the substrate has formed thereupon and/or thereover any of several additional microelectronic layers as are conventional within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, the substrate 10, typically and preferably when the substrate 10 consists of or comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may be selected from the group including but not limited to resistors, transistors, diodes and capacitors.

Within the preferred embodiment of the present invention with respect to the series of bond pads 12a, 12b and 12c, the series of bond pads 12a, 12b and 12c is formed of a conductor material as is otherwise conventional in the art of microelectronic fabrication, such as but not limited to a metal, a metal alloy, a doped polysilicon (having a dopant concentration of greater than about 10E18~10E14 atoms per cubic centimeter) and a polycide (doped polysilicon/metal silicide stack) conductor material. Typically and preferably, the series of bond pads 12a, 12b and 12c is formed with a bidirectional (i.e., areal) linewidth of from about 50 to about 200 microns and a thickness of from about 5000 to about 20000 angstroms.

Also shown within the schematic cross-sectional diagram of FIG. 1, formed upon portions of the substrate 10 adjacent the series of bond pads 12a, 12b and 12c, and passivating a series of opposite edges of the series of bond pads 12a, 12b and 12c, is a series of patterned passivation layers 14a, 14b, 14c and 14d.

Within the preferred embodiment of the present invention, the series of patterned passivation layers 14a, 14b, 14c and 14d may be formed of passivation dielectric materials as are conventional in the art of microelectronic fabrication, such passivation dielectric materials being selected from the group including but not limited to silicon oxide passivation dielectric materials, silicon nitride passivation dielectric materials, silicon oxynitride passivation dielectric materials, laminates thereof and aggregates thereof. Typically and preferably, the series of patterned passivation layers 14a, 14b, 14c and 14d is formed at least in part of a silicon nitride passivation dielectric material, and formed to a thickness of from about 5000 to about 12000 angstroms, to leave exposed portions of the bond pads 12a, 12b and 12c of bidirectional (i.e., areal) linewidth of from about 50 to about 200 microns.

Shown also within the schematic cross-sectional diagram of FIG. 1 formed upon the series of patterned passivation layers 14a, 14b, 14c and 14d and exposed portions of the series of bond pads 12a, 12b and 12c not covered by the series of patterned passivation layers 14a, 14b, 14c and 14d is a blanket electroplating seed layer 16.

Within the preferred embodiment of the present invention, the blanket electroplating seed layer 16 may be formed of electroplating seed materials as are conventional in the art of microelectronic fabrication, such electroplating seed materials being selected from the group including but not limited to metal and metal alloy electroplating seed materials, and further wherein the blanket slectroplating seed layer 16 may also include appropriate layers formed of appropriate barrier materials.

Within the preferred embodiment of the present invention, the blanket electroplating seed layer 16 is typically and preferably formed of a barrier material, such as but not limited to titanium barrier material, formed to a thickness of from about 800 to about 1200 angstroms, in turn having formed thereupon a conductor material such as but not limited to a copper conductor material, formed to a thickness of from about 4000 to about 8000 angstroms.

Finally, there is shown within the schematic cross-sectional diagram of FIG. 1 a blanket photoresist layer 18 formed upon the blanket electroplating seed layer 16.

Within the preferred embodiment of the present invention with respect to the blanket photoresist layer 18, the blanket photoresist layer 18 is formed of a negative photoresist material, such as but not limited to a polymerized negative photoresist material, which is available, for example and without limitation: (1) from JSR as THB-130N negative photoresist material when provided as a spin-coated negative photoresist material; and (2) from TOK as ORDYL Series negative photoresist material when provided as a laminated thin film negative photoresist material. Typically and preferably, the blanket photoresist layer 18 is formed to a thickness of from about 20 to about 150 microns.

Figure 2:
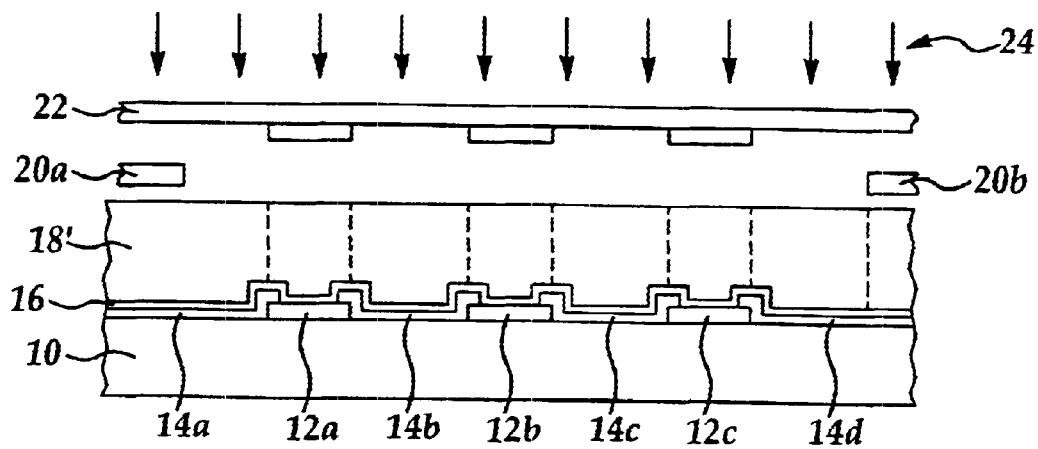

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket photoresist layer 18 has been photoexposed to form a photoexposed blanket photoresist layer 18', while employing a photomask reticle 22, in conjunction with an actinic photoexposure radiation beam 24.

Within the preferred embodiment of the present invention, the photomask reticle 22 and the actinic photoexposure radiation beam 24 are otherwise conventional in the art of microelectronic fabrication and will typically and preferably include a quartz substrate based photomask reticle 22, in conjunction with an actinic photoexposure radiation beam 24 employing photoexposure radiation in the near ultraviolet photoexposure wavelength region (i.e., 436 nanometers) or deep ultraviolet photoexposure wavelength region (i.e., 193 nanometers). Similarly, although the preferred embodiment of the present invention illustrates the photomask reticle 22 as a 1×direct scanning photomask reticle 22, there may also be employed within the present invention as the photomask reticle 22 a step and repeat photomask reticle which employs multiple separated geometrically reduced photoexposures of a blanket photoresist layer, such as the blanket photoresist layer 18, when forming a photoexposed blanket photoresist layer, such as the photoexposed blanket photoresist layer 18'.

Finally, there is also shown within the schematic cross-sectional diagram of FIG. 2 a pair of edge exclusion shutter blades 20a and 20b which at all times during photoexposure of the blanket photoresist layer 18 as illustrated within the schematic cross-sectional diagram of FIG. 1 to form the photoexposed blanket photoresist layer 18 as illustrated within the schematic cross-sectional diagram of FIG. 2 cover an annular edge ring portion of the blanket photoresist layer 18 formed over the substrate 10. As is illustrated in part within FIG. 2 and as will be illustrated in further detail within following figures (see in particular FIG. 4 and related disclosure), an annular edge ring portion of the blanket photoresist layer 18, the photoexposed blanket photoresist layer 18', the blanket electroplating seed layer 16 or the substrate 10 is intended to include an outer peripheral edge thereof and extend inward over the substrate. While the preferred embodiment of the present invention illustrates the present invention within the context of the pair of edge ring exclusion shutter blades 20a and 20b, within the context of the present invention any other annular edge ring exclusion apparatus which excludes the actinic photoexposure radiation beam 24 entirely from an annular edge ring of the blanket photoresist layer 18 and the substrate 10 may also be employed. Similarly, such other annular edge ring exclusion apparatus may include, but is not limited to an annular edge ring clamp exclusion apparatus.

Figure 3:
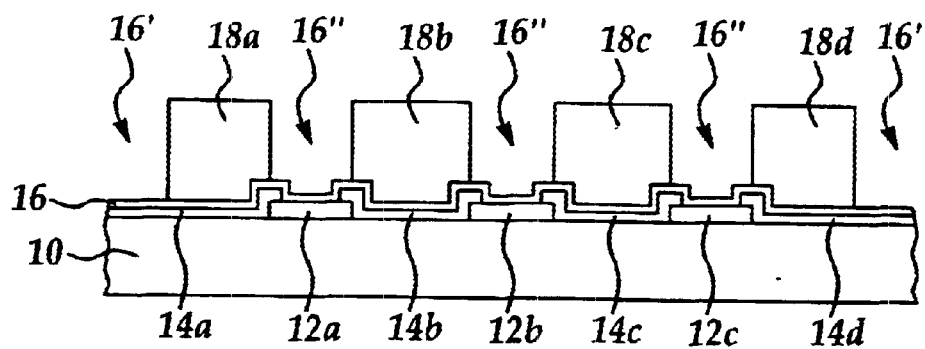

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the photoexposed blanket photoresist layer 18' has been developed to form a series of patterned photoresist layers 18a, 18b, 18c and 18d which leave exposed at their periphery an annular edge ring 16' of the blanket electroplating seed layer 16 and within their centers a series of exposed aperture regions 16' of the blanket electroplating seed layer 16.

Within the preferred embodiment of the present invention, the photoexposed blanket photoresist layer 18' as illustrated within the schematic cross-sectional diagram of FIG. 2 may be developed to form the series of patterned photoresist layers 18a, 18b, 18c and 18d as illustrated in the schematic cross-sectional diagram of FIG. 3 while employing photoresist developer methods and materials as are otherwise conventional in the art of microelectronic fabrication, such photoresist developer methods and materials typically and preferably including but not limited to wet chemical photoresist developer methods and materials.

Figure 4:
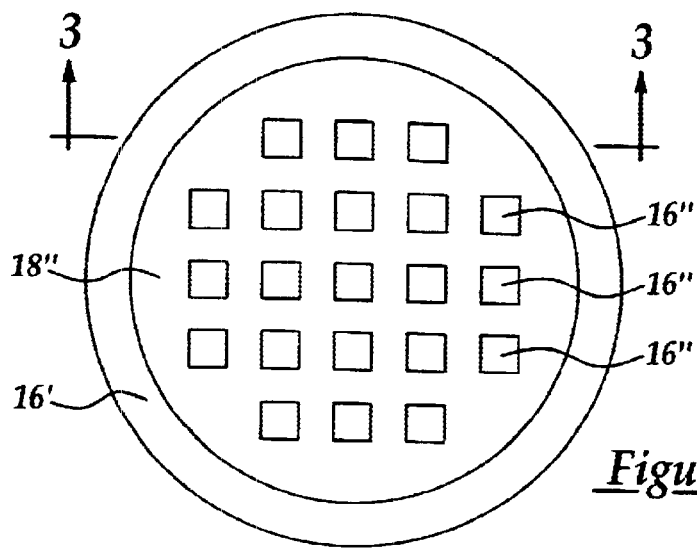

Referring now to FIG. 4, there is shown a schematic plan-view diagram of a microelectronic fabrication corresponding with the microelectronic fabrication whose schematic cross-sectional diagram is illustrated in FIG. 3.

As is illustrated within the schematic plan-view diagram of FIG. 4, there is shown in general a circular microelectronic substrate having formed thereover the blanket electroplating seed layer 16 which in turn has formed thereupon the patterned photoresist layer 18" which leaves completely exposed an annular edge ring 16' of the blanket electroplating seed layer 16 as well as a series of exposed aperture regions 16" of the blanket electroplating seed layer 16. Within the preferred embodiment of the present invention, the completely exposed annular edge ring 16' of the blanket electroplating seed layer 16 has a radius dimension of from about 1 to about 3 millimeters.

Figure 5:
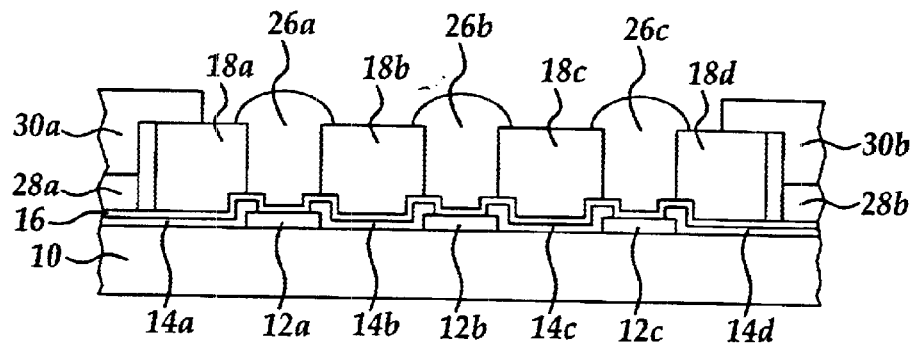

Referring now to FIG. 5, there is shown a schematic cross-sectional diagram illustrating the results of further processing of the microelectronic fabrication whose schematic plan-view diagram is illustrated in FIG. 4 or whose schematic cross-sectional diagram is illustrated in FIG. 3.

Shown in FIG. 5 is a schematic cross-sectional diagram of a microelectronic fabrication otherwise equivalent to the microelectronic fabrication whose schematic plan-view diagram is illustrated in FIG. 4 or whose schematic cross-sectional diagram is illustrated in FIG. 3, but wherein in a first instance there is contacted to the blanket electroplating seed layer 16 at the location of the fully exposed annular edge ring 16' of the blanket electroplating seed layer 16 a pair of annular ring electrodes 28a and 28b which have further laminated thereto a pair of sealant structures 30a and 30b which in-turn seal to the pair of patterned photoresist layers 18a and 18d.

Within the preferred embodiment of the present invention, the pair of annular ring electrodes 28a and 28b is intended to represent a single annular ring electrode which contacts the fully exposed annular region 16' of the blanket electroplating seed layer 16 as illustrated within the schematic plan-view diagram of FIG. 4. Similarly, the pair of sealant layers 30a and 30b laminated thereto is intended to represent a single annular ring of sealant material which seals to a periphery of the patterned photoresist layer 18" as illustrated within the schematic cross-sectional diagram of FIG. 4, thus sealing the pair of annular ring electrodes 28a and 28b which represent the single annular ring electrode from an electroplating solution which is employed for electroplating a series of electroplated patterned conductor layers upon the exposed aperture regions 16" of the blanket electroplating seed layer 16 as illustrated within the schematic cross-sectional diagram of FIG. 4.

Finally, there is also shown within the schematic cross-sectional diagram of FIG. 5 a series of electroplated patterned solder layers 26a, 26b and 26c formed into the series of apertures defined by the series of patterned photoresist layers 18a, 18b, 18c and 18d. The series of electroplated patterned solder layers 26a, 26b and 26c is formed employing an electroplating method as is otherwise conventional in the art of microelectronic fabrication. Although not specifically illustrated within the schematic cross-sectional diagram of FIG. 5, the series of electroplated patterned solder layers 26a, 26b and 26c is typically and preferably formed upon a corresponding series of electroplated patterned copper core layers of thickness about 1 to about 5 microns in turn first having formed thereupon a corresponding series of electroplated patterned nickel barrier layers of thickness about 1 to about 5 microns. In turn, the series of electroplated patterned solder layers 26a, 26b and 26c is formed to a thickness of from about 20 to about 150 microns from any of several solder materials as are conventional in the art of microelectronic fabrication.

Figure 6:
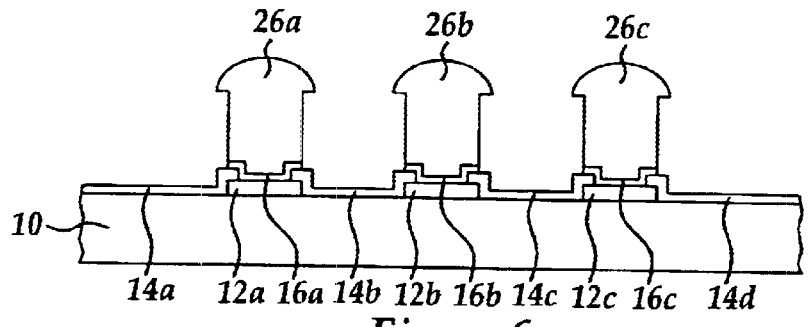

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein, in a first instance, there has been removed from over the microelectronic fabrication the pair of annular edge ring electrodes 28a and 28b having laminated thereto the pair of sealant structures 30a and 30b. Similarly, there is then also stripped from the microelectronic fabrication whose schematic cross-sectional diagram is illustrated in FIG. 5 the series of patterned photoresist layers 18a, 18b, 18c and 18d to provide in part the microelectronic fabrication whose schematic cross-sectional diagram is illustrated in FIG. 6.

The series of patterned photoresist layers 18a, 18b, 18c and 18d may be stripped from the microelectronic fabrication whose schematic cross-sectional diagram is illustrated in FIG. 5 to provide in part the microelectronic fabrication whose schematic cross-sectional diagram is illustrated in FIG. 6 while employing photoresist stripping methods and materials as are conventional in the art of microelectronic fabrication, such photoresist stripping methods and materials including but not limited to wet chemical photoresist stripping methods and materials and dry plasma photoresist stripping methods and materials.

Finally, there is also shown within the schematic cross-sectional diagram of FIG. 6 a series of patterned electroplating seed layers 16a, 16b and 16c which are formed by etching of the blanket electroplating seed layer 16 while employing an etchant, such as but not limited to a wet chemical etchant or a dry plasma etchant, as is otherwise conventional in the art of microelectronic fabrication.

Figure 7:
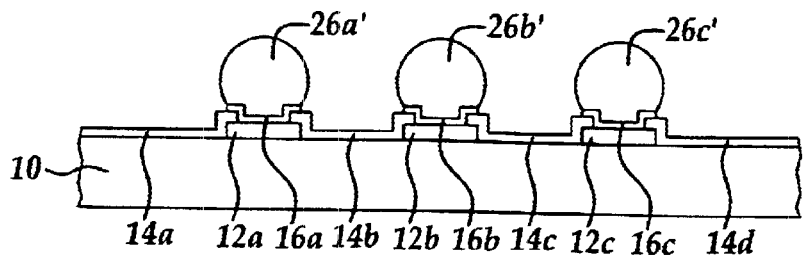

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein the series of electroplated patterned solder layers 26a, 26b and 26c has been reflowed to form a series of reflowed electroplated patterned solder layers 26a', 26b' and 26c'.

Within the preferred embodiment of the present invention, the series of electroplated patterned solder layers 26a, 26b and 26c as illustrated within the schematic cross-sectional diagram of FIG. 6 may be reflowed to form the series of reflowed electroplated patterned solder layers 26a', 26b' and 26c' as illustrated within the schematic cross-sectional diagram of FIG. 7 while employing thermal annealing reflow methods and conditions as are otherwise conventional in the art of microelectronic fabrication, such thermal annealing reflow methods and conditions typically and preferably employing a temperature of from about 200 to about 400 degrees centigrade for a time period of from about 50 to about 80 minutes.

Upon forming the microelectronic fabrication whose schematic cross-sectional diagram is illustrated in FIG. 7, there is formed a microelectronic fabrication in accord with the preferred embodiment of the present invention. In accord with the present invention, the microelectronic fabrication has formed therein a series of reflowed patterned solder layers of uniform thickness since there was employed when forming a series of patterned solder layers from which was formed the series of reflowed patterned solder layers a patterned photoresist plating mask which was totally excluded from over an annular edge ring surface of a blanket electroplating seed layer to which was contacted a annular cathode electrode ring which was employed for electroplating the series of electroplated patterned solder layers.

As is further understood by a person skilled in the art, the preferred embodiment of the present invention is illustrative of the present invention rather than limiting of the present invention. Revisions and modifications may be made to methods, materials, structures and dimensions through which is fabricated a microelectronic fabrication in accord with the preferred embodiment of the present invention, while still fabricating a microelectronic fabrication in accord with the present invention, further in accord with the accompanying claims.

What is claimed is:

1. A method for forming a patterned photoresist layer comprising:
   providing a substrate;
   forming over the substrate a blanket photoresist layer formed of a negative photoresist material;
   photoexposing the blanket photoresist layer to form a photoexposed blanket photoresist layer while employing a photoexposure apparatus which employs an annular edge ring exclusion apparatus positioned over an annular edge ring of the blanket photoresist layer and the substrate, where the annular edge ring of the substrate extends inward from an edge of the substrate; and
   developing the photoexposed blanket photoresist layer to form a patterned photoresist layer having an annular edge ring excluded over the annular edge ring of the substrate.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the blanket photoresist layer is formed employing a method selected from the group consisting of photoresist spin-on methods and photoresist film lamination methods.

4. The method of claim 1 wherein the blanket photoresist layer is formed to a thickness of from about 20000 to about 150000 angstroms.

5. The method of claim 1 wherein the annular edge ring exclusion apparatus is selected from the group consisting of an annular edge ring exclusion shutter and an annular edge ring exclusion clamp.

6. A method for forming an electroplated patterned conductor layer comprising:
   providing a substrate;
   forming over the substrate a blanket electroplating seed layer;
   forming over the blanket electroplating seed layer a blanket photoresist layer formed of a negative photoresist material;

photoexposing the blanket photoresist layer to form a photoexposed blanket photoresist layer while employing a photoexposure apparatus which employs an annular edge ring exclusion apparatus positioned over an annular edge ring of the blanket photoresist layer and the blanket electroplating seed layer, where the annular edge ring of the blanket electroplating seed layer extends inward from an edge of the substrate;

developing the photoexposed blanket photoresist layer to form a patterned photoresist electroplating mask layer having an annular edge ring excluded over the annular edge ring of the blanket electroplating seed layer;

contacting to the annular edge ring of the blanket electroplating seed layer a annular cathode electrode ring; and plating, while employing an electroplating method in conjunction with the patterned photoresist electroplating mask, a patterned conductor layer upon the blanket electroplating seed layer.

7. The method of claim 6 wherein by employing the annular edge exclusion apparatus the patterned conductor layer is formed with enhanced thickness uniformity.

8. The method of claim 6 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

9. The method of claim 6 wherein the blanket electroplating seed layer is formed of a copper seed material.

10. The method of claim 6 wherein the blanket electroplating seed layer is formed to a thickness of from about 1000 to about 8000 angstroms.

11. The method of claim 6 wherein the blanket photoresist layer is formed employing a method selected from the group consisting of photoresist spin-on methods and photoresist film lamination methods.

12. The method of claim 6 wherein the blanket photoresist layer is formed to a thickness of from about 20000 to about 150000 angstroms.

13. The method of claim 6 wherein the annular edge ring exclusion apparatus is selected from the group consisting of an annular edge ring exclusion shutter and an annular edge ring exclusion clamp.

14. The method of claim 6 wherein the patterned conductor layer is selected from the group consisting of patterned contact conductor layers, patterned interconnect conductor layers, patterned terminal conductor layers and patterned solder conductor layers.

* * * * *